United States Patent [19]

Yang Lee

[11] Patent Number: 5,169,333
[45] Date of Patent: Dec. 8, 1992

[54] DURABLE LATCH WITH MOUNTING PEG OF MEMORY MODULE SOCKET

[76] Inventor: Su-Lan Yang Lee, 4th Floor, No. 506-2, Yuan-San Road, Chung-Ho City, Taipei Hsien, Taiwan

[21] Appl. No.: 766,385

[22] Filed: Sep. 27, 1991

[51] Int. Cl.⁵ .............................................. H01R 13/00
[52] U.S. Cl. .................................................... 439/326
[58] Field of Search ........................ 439/296, 326–328, 439/629–637

[56] References Cited

U.S. PATENT DOCUMENTS

| | | |
|---|---|---|
| 4,713,013 | 12/1987 | Regnier et al. |
| 4,737,120 | 4/1988 | Grabbe et al. |
| 4,850,891 | 7/1989 | Walkup et al. |
| 4,850,892 | 7/1989 | Clayton et al. |
| 4,932,617 | 5/1989 | Brown |
| 4,995,825 | 2/1991 | Korsunsky et al. |
| 5,004,429 | 4/1991 | Yagi .................. 439/326 |

Primary Examiner—Joseph H. McGlynn
Attorney, Agent, or Firm—Lowe, Price, LeBlanc & Becker

[57] ABSTRACT

A single in line memory module (SIMM) socket includes an inlaiding member comprising a retention post, mounting portion and latch member. The mounting portion can be securely mounted into the mounting hole on the insulating housing of socket for retaining the memory module with the latch member. Further with the retention post the whole socket can be secured to the printed circuit board so that the spacing between the socket and printed circuit board can be prevented from increasing during the soldering process. Morever it is very convenient for releasing the socket from the printed circuit board once it were damaged.

4 Claims, 9 Drawing Sheets

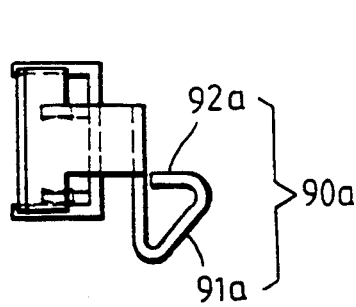
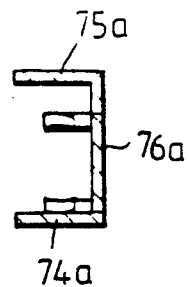
FIG.12    FIG.13
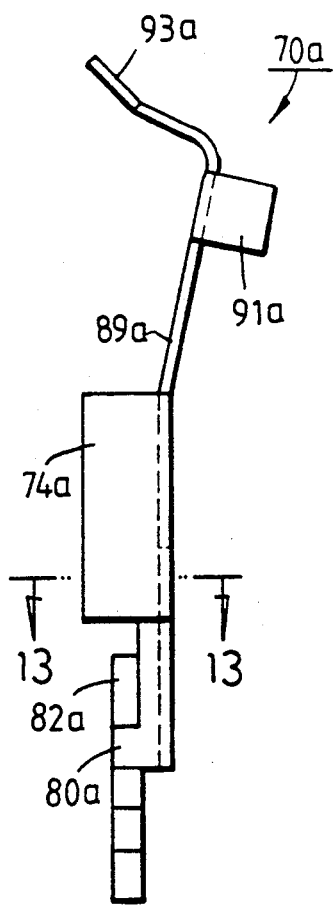
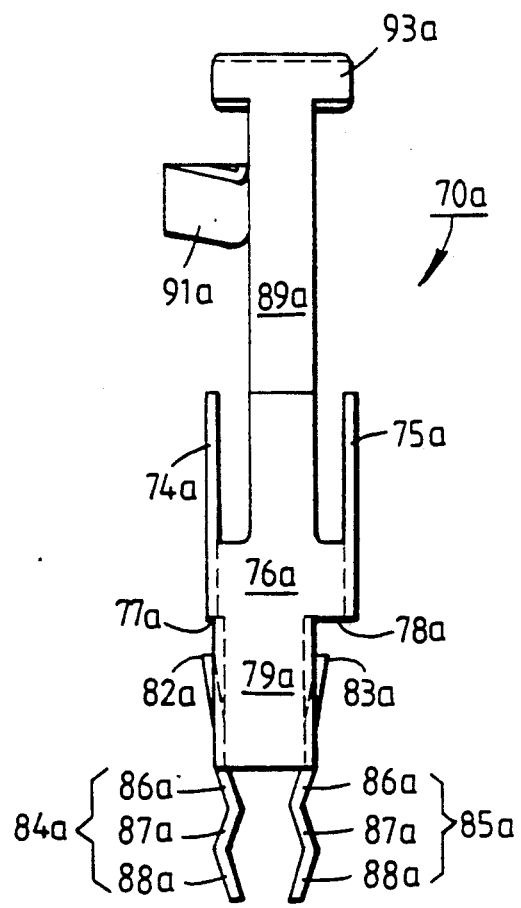
FIG.10    FIG.11

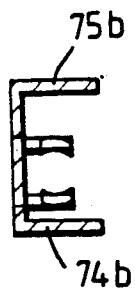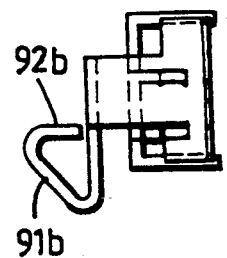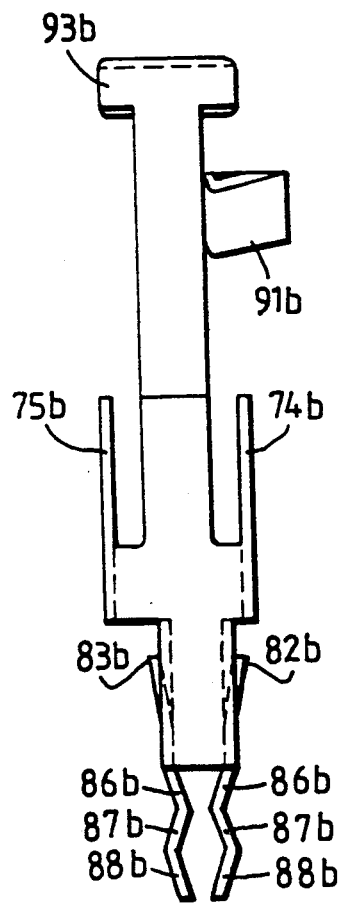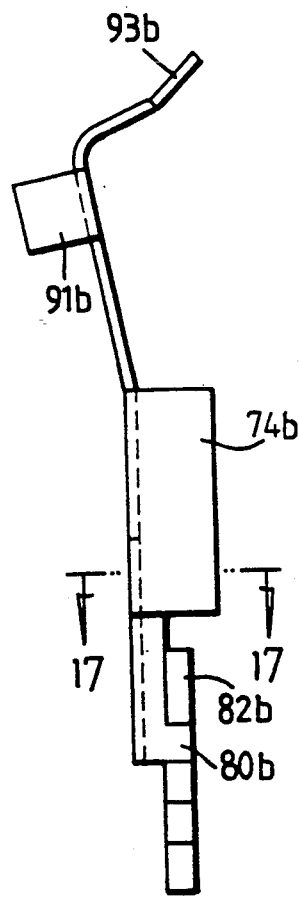
FIG.17　FIG.16
FIG.15　FIG.14

DURABLE LATCH WITH MOUNTING PEG OF MEMORY MODULE SOCKET

BACKGROUND OF THE INVENTION

1. Field of the Invention

The invention relates to an electrical connector, and more particularly, to a memory module socket for releasably securing a memory module, such as single in-line memory module. The subject matter of the invention constitutes an improvement for the latch of the socket and for a mounting peg to retain the insulating housing of socket in mounting aperture of printed circuit board.

FIG. 1 depicts a typical example of socket 40 for securing a memory module 31 to a printed circuit board 32. The socket 40 has an insulating housing 41, which is preferably injection molded from electrically insulative and temperature-resistance plastic. An elongated socket 42 is located along the longitudinal axis of insulating housing 41. A plurality of slots 43 are in sequence located along and perpendicularly in relation to the elongated socket 42. A plurality of electrically conductive contact elements 57 are respectively inserted into each slot 43. On the left end of this insulating housing 41, a retention post 44 integrally formed to extend upward from the insulating housing 41. A securing projection 45 extends transversely from the upper end of the retention post 44 and perpendicular to the longitudinal axis of insulating housing 41. To the left of the retention post 44 is a latch member 56, which perpendicularly extends upward from the insulating housing 41. Located on the upper end of latching member 56 is a latching projection 46 that extends toward the other end of insulating housing 41. The right end of insulating housing 41 is provided with the same features as the left end of insulating housing 41, but symmetrically arranged: a retention post 47 with a securing projection 49, and a latch member 48 with a latching projection 50.

Each end of the single in-line memory module 31 includes securing holes 58 and 59. The single in-line memory module 31 is inserted into the elongated socket 42 of insulating housing 41 and each upper end edge of in-line memory module 31 slides over the latching projections 46 and 50 to allow securing holes 58 and 59 to be received within securing projections 45 and 49, respectively, which secures each edge of the single in-line memory module 31 with latching projections 46 and 50.

To release the single in-line memory module 31, push outwardly each of latch members 48 and 56, to force each of latching projections 46 and 50 to disengage from each edge of single in-line memory module 31. The single in-line memory module 31 now disengages from the elongated socket 42 of insulating housing 41.

At each end of the insulating housing 41 are mounting pegs 51 and 52, each perpendicularly extending downward wherein mounting peg 51 has a smaller diameter than mounting peg 52 for inserting into mounting apertures 53 and 54. The mounting apertures have different inside diameter from each other to prevent the insulating housing 41 from being incorrectly mounted.

However, two major problems are associated with the single in-line memory module and socket. The first problem is that the portion that engages latch members 45 and 56 with the insulating housing 41 is liable to get cracked or even broken. The second problem is when each of the mounting pegs 51 and 52 of insulating housing 41 are inserted into the mounting apertures 53 and 54, respectively, of printed circuit board 32 they must be welded within a soldering stove. Specifically, the contact pin 55 extending downwardly from the slot 43 will be attached to the printed circuit board 32 by welding. During the soldering process, liquified solder will flow upward to push the insulating housing 41 upward, increasing the spacing between the insulating housing 41 and printed circuit board 32, resulting in the failure of insulating housing 41 to be firmly secured to the printed circuit board 32.

To overcome the first problem, U.S. Pat. Nos. 4,713,013, 4,832,617, 4,850,892, 4,850,891, 4,737,120 and 4,995,825 relate to disclose an improvement with respect to the latch member, specifically metallic latch members are fabricated in place of conventional plastic latch members, thus making the latch members more durable. However, they fail to solve the second problem, firmly securing the insulating housing to the printed circuit board, because the outer edge of each mounting peg extends downward from the insulating housing and is fabricated in a cylindrical shape.

SUMMARY OF THE INVENTION

To overcome aforesaid problems, one object of the present invention is to provide an improvement for single in-line memory module sockets that allows the insulating housing to be secured firmly to the printed circuit board, and, to maintain the spacing between the bottom portion of insulating housing and the surface of printed circuit board, within a desired value during soldering process.

Another object of the present invention is to provide an improvement for single in-line memory module sockets, wherein the securing projection and latch member are fabricated from metallic material integrally pressing molded that can be firmly mounted in the insulating housing.

Still another object of the present invention is to provide an improvement for single in-line memory module sockets that allows the insulating housing to be firmly secured to the printed circuit board by merely improving the structure of securing projection, while both insulating housing and improved securing projection are integrally injection molded.

The configuration of a single in-line memory module socket in the present invention is suitable for mounting on the printed circuit board to form a holder and a series of resilient contact elements. When the memory module is inserted into the holder these resilient contact elements can be used for engaging with the contact edge pads of memory module. The socket includes: an insulating housing, an elongated socket, and a plurality of slots mounted perpendicularly to the elongated socket, between the ends of the insulating housing. A plurality of contact elements are inserted into each respective slot. Each end of the insulating housing contains identical features, but in a symmetrical arrangement. Each end includes the following. A retention post respectively extending upwardly from the insulating housing, a securing projection extending transversely from the end of the retention post. A mounting portion that extends upward, and contains a first mounting hole and a second mounting hole, the first mounting hole and second mounting hole are connected to each other so as to penetrate through the mounting portion along the longitudinal axis of the mounting portion. The first mounting hole has different cross section than the second mounting hole. The second mounting hole has a mounting slot. An inlaid member having an inlaid portion for inserting into the first and second mounting holes respectively, the inlaid portion having at least two inlaid projections for inserting securely into the mounting slots. A securing projection integrally extending downwardly from the mounting portion and having at least two peg members distributed along a circumstance on an equi-distance basis and ejectable individually. The securing projection is designed with a greater shoulder portion than its neck portion and an approximately conical guiding portion, of which the neck portion is located between the shoulder portion and guiding portion, while as the guiding portion is located at the utmost leading end of securing projection, to facilitate inserting into the securing hole of the printed circuit board and securing firmly to the printed circuit board, but permitting the securing projection to be disengaged from the securing hole by application of force. A latch member integrally formed by extending upwardly from the mounting portion, includes: a resilient arm integrally formed by extending upwardly from the mounting portion; a latching projection sideways extending from the resilient arm, including: a latching surface generally parallel to the elongated socket, and a guiding incline surface that is inclined toward the latching surface to facilitate the guiding of the memory module into the latching surface; and a liberating portion integrally formed by inclinationally extending from the resilient portion along its longitudinal axis. Also the peg member can be integrally formed by extending upwardly from the insulating housing instead of extending from inlaid member and inlaid member that may have no inlaid member, can be integrally molded with the mounting portion of insulating housing.

BRIEF DESCRIPTION OF THE DRAWINGS

FIG. 10 is a front view of the left end portion of single in-line memory module socket shown with metallic inlaid member mounted therein.

FIG. 11 is a view in the right section of the left end portion of single in-line memory module socket shown with metallic inlaid member mounted therein.

FIG. 12 is a top plan view of the left end portion of single in-line memory module socket shown with metallic inlaid member mounted therein.

FIG. 13 is a perspective view taken along line 13—13 shown in FIG. 10.

FIG. 14 is a front view of the right end portion of single in-line memory module socket shown with metallic inlaid member mounted therein.

FIG. 15 is a view in the left section of the right end portion of single in-line memory module socket with metallic inlaid member mounted therein.

FIG. 16 is a top plan view of the right end portion of single in-line memory module socket shown with metallic inlaid member mounted therein.

FIG. 17 is a perspective view taken along line 17—17 shown in FIG. 14.

DETAILED DESCRIPTION OF THE PREFERRED EMBODIMENT

Figure 1:
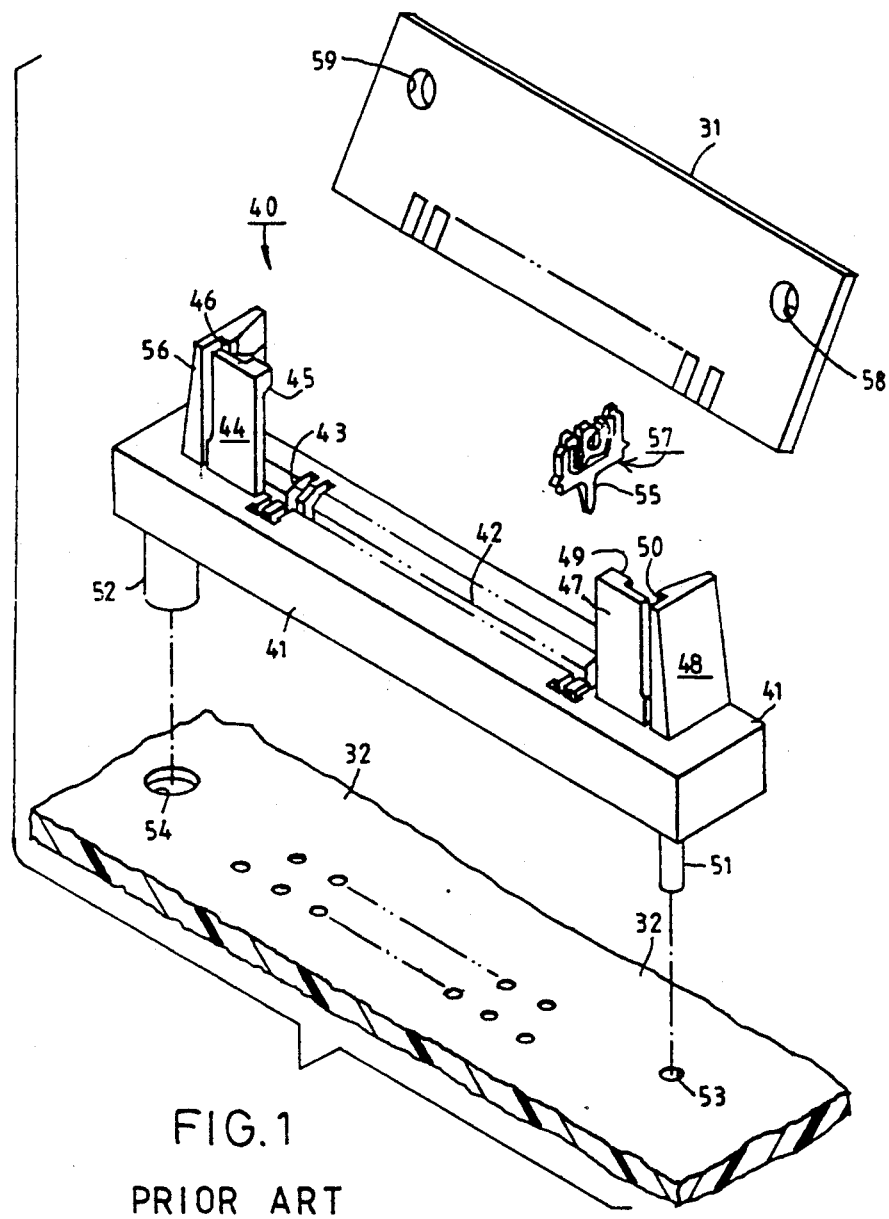
FIG. 1 is a fragmentary perspective view of single in-line memory module socket.
Figure 2:
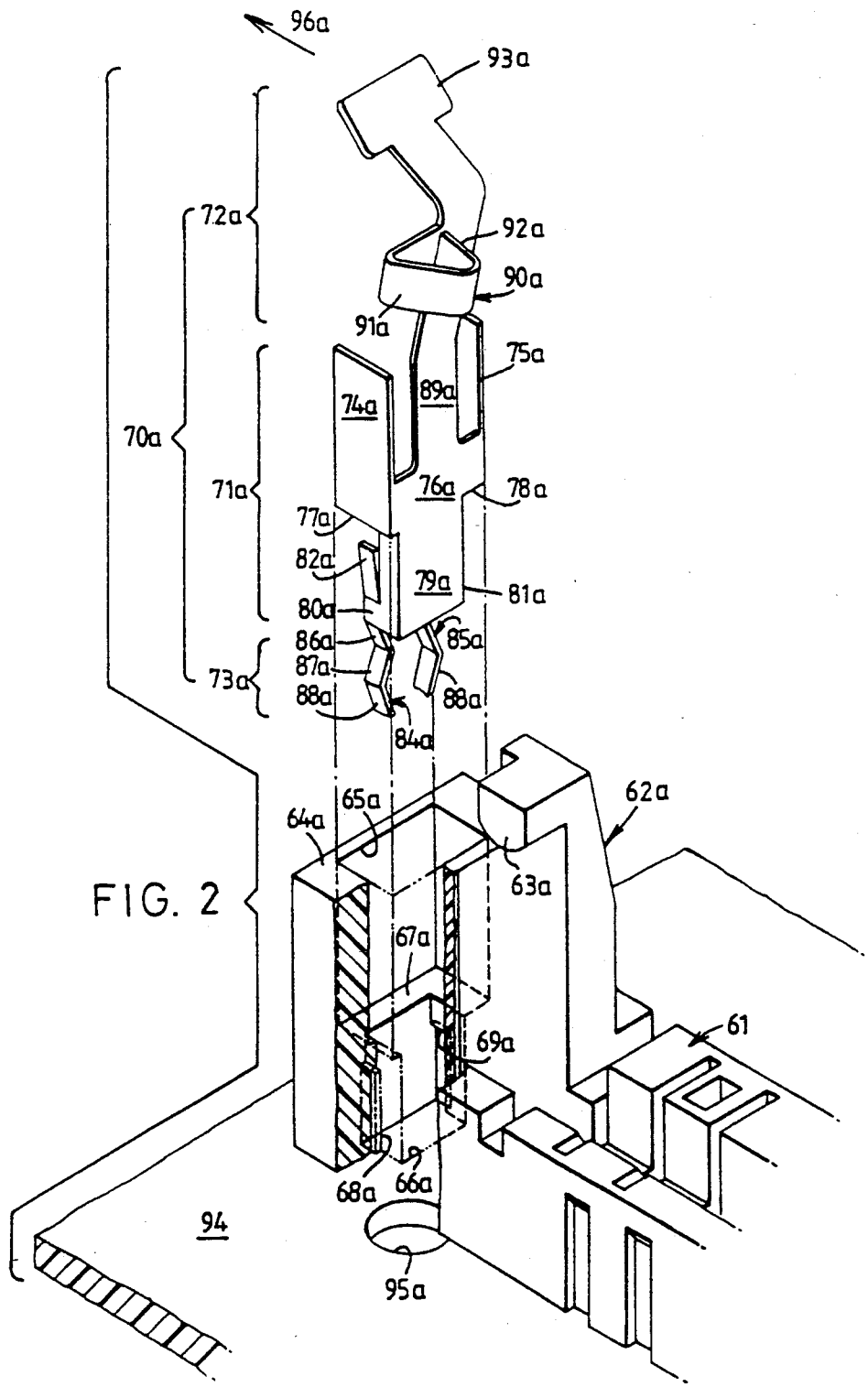
FIG. 2 is a fragmentary composite perspective view illustrating the left end portion of single in-line memory module socket.
Figure 3:
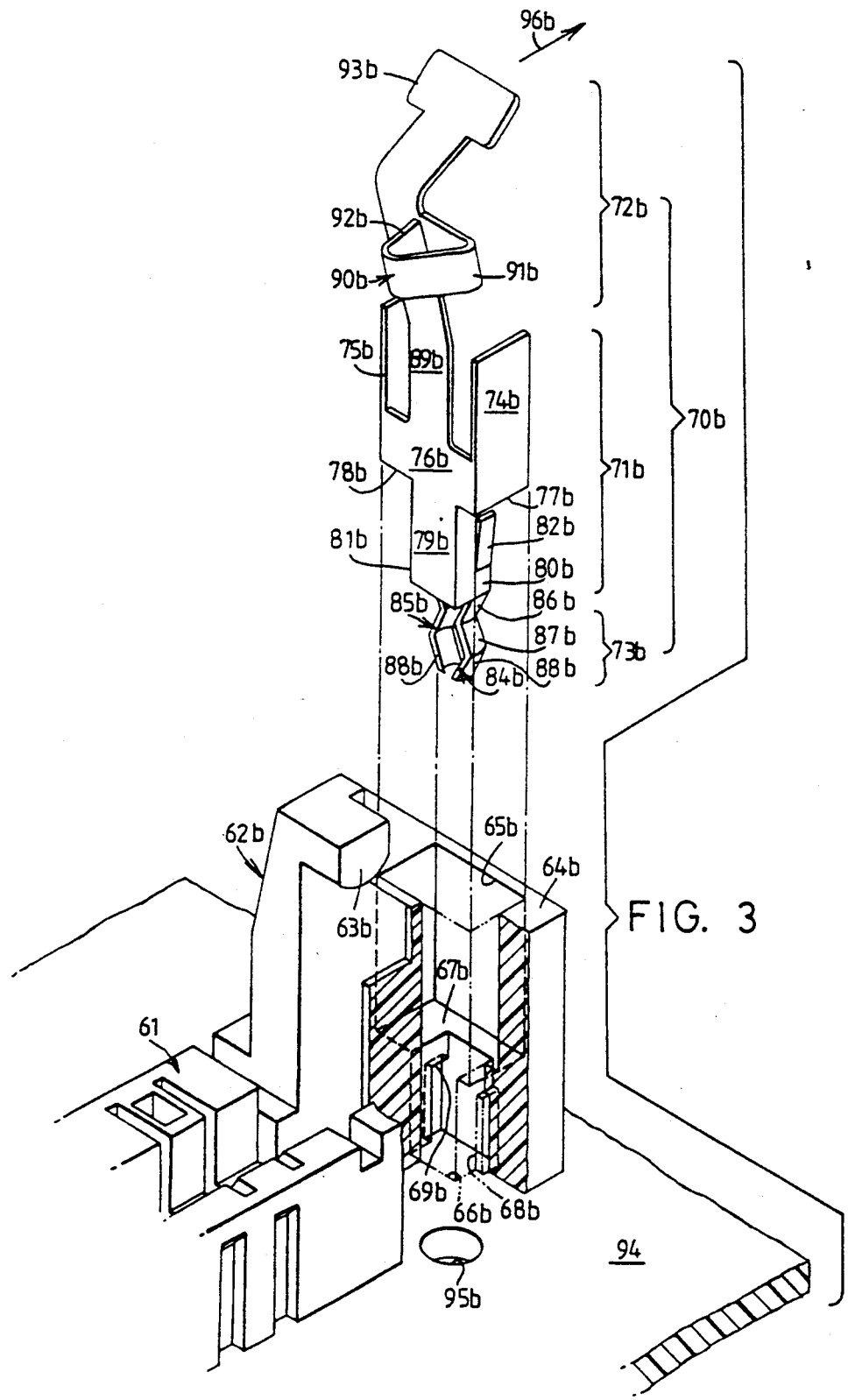
FIG. 3 is a fragmentary composite perspective view illustrating the right end portion of single in-line memory module socket.
Figure 4:
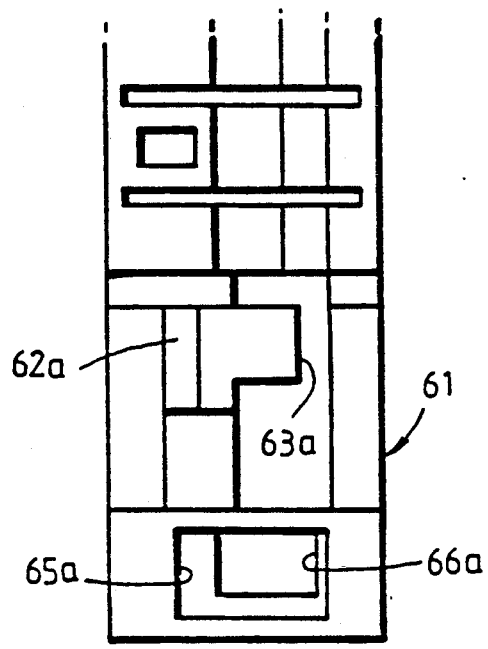
FIG. 4 is a top plan view of the end portion of single in-line memory module socket shown apart from metallic inlaid member.
Figure 5:
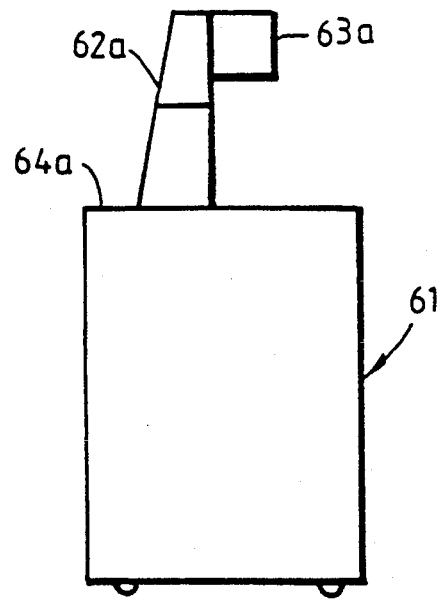
FIG. 5 is an end elevational view of single in-line memory module socket shown apart from metallic inlaid member.

FIG. 2 shows that the left end portion of insulative housing 61 extends upward with a retention post 62a that extends transversely with a securing projection 63a. The elements of the left end portion are designated by additional character "a" and the right end portion by additional character "b". The right end portion is a mirror image of the left end portion.

The end of insulating housing 61 extends upward with a mounting portion 64a, and a stair-shaped rectangular through hole located along mounting portion 64a and perpendicular to insulating housing 61. The first portion of stair-shaped rectangular through hole is the first mounting hole 65a and the second portion is the second mounting hole 66a. The first mounting hole 65a is longer and wider than the second mounting hole 66a, the junction of the two mounting holes defines a shoulder 67a. Each side of the second mounting hole 66a includes respective mounting slots 68a and 69a. Metallic inlaid member 70a contains an inlaid portion 71a, latching portion 72a and securing projection 73a. Inlaid portion 71a comprises three inlaid walls 74a, 75a and 76a. The lower edge of inlaid walls 74a, 75a and 76a have two precipices, 77a and 78a. The inlaid wall 76a extends downward, and includes an inlaid wall 79a. Each side of inlaid wall 79a extends perpendicular with respective inlaid walls 80a and 81a. Each of the inlaid walls 80a and 81a extends upward and includes respective inlaid projections 82a and 83a (shown in FIG. 12). Peg members 84a and 85a extends downward from respective inlaid walls 80a and 81a. Both peg members are symmetrical (also three or more peg members can be fabricated), having a smaller neck portion 86a, a larger shoulder, and a guiding portion 88a with a smaller lead end.

A resilient arm 89a extends upward from inlaid wall 76a, and a latching projection 90a, that extends sideways from resilient arm 89a, includes a guiding incline surface 91a and latching surface 92a. A liberating portion 93a extends upward the resilient arm 89a.

Figure 6:
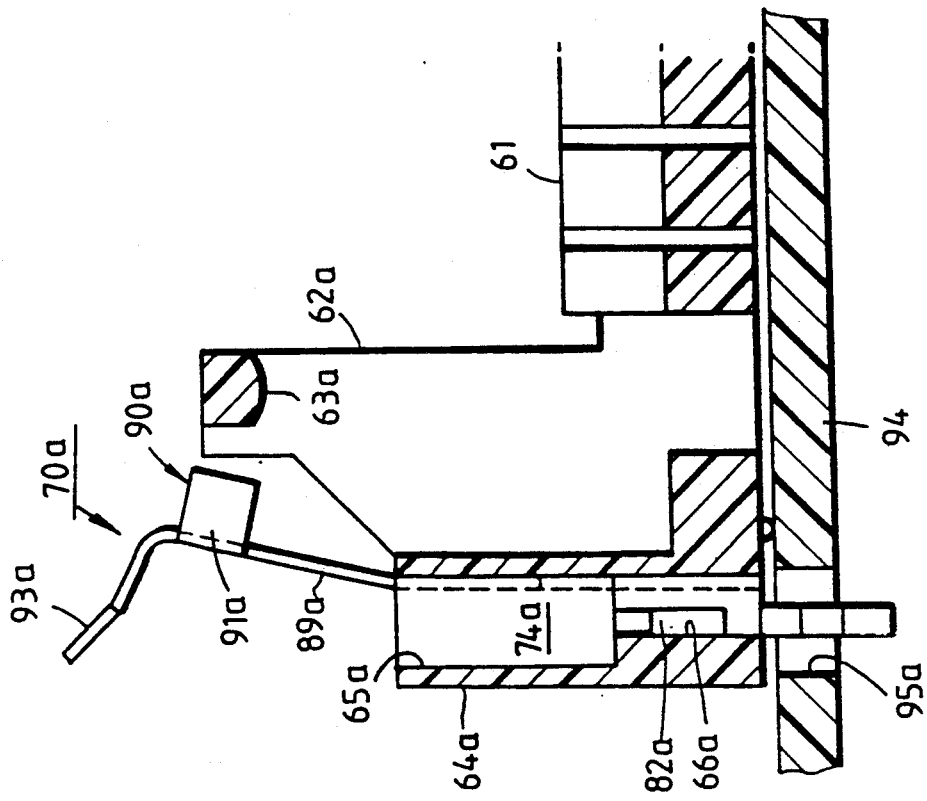
FIG. 6 is a fragmentary elevational view partly in vertical section of the left end portion of single in-line memory module socket shown with metallic inlaid member mounted in the insulating housing.
Figure 7:
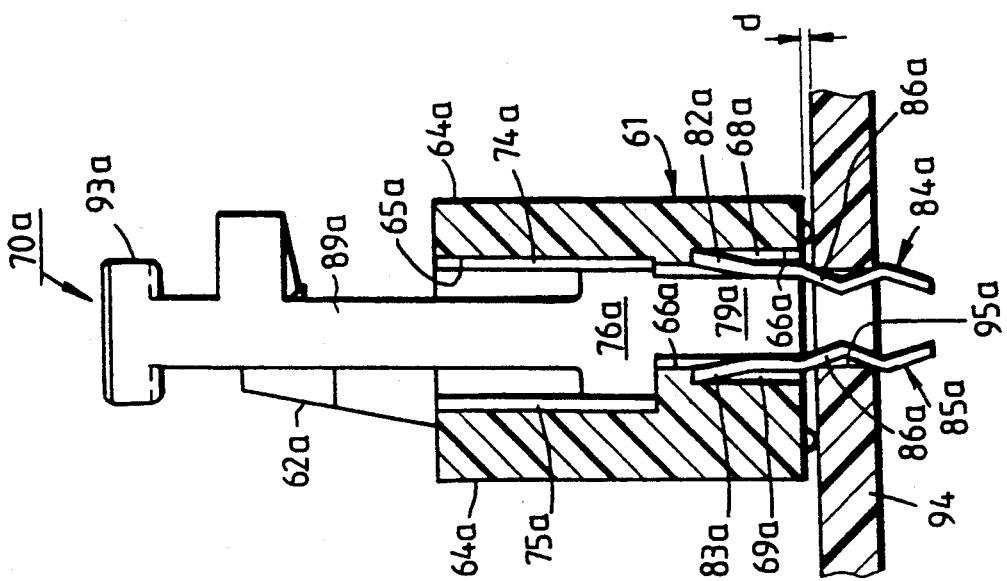
FIG. 7 is a fragmentary elevational view partly in traversed section of the left end portion of single in-line memory module socket shown with metallic inlaid member mounted in the insulating housing.
Figure 9:
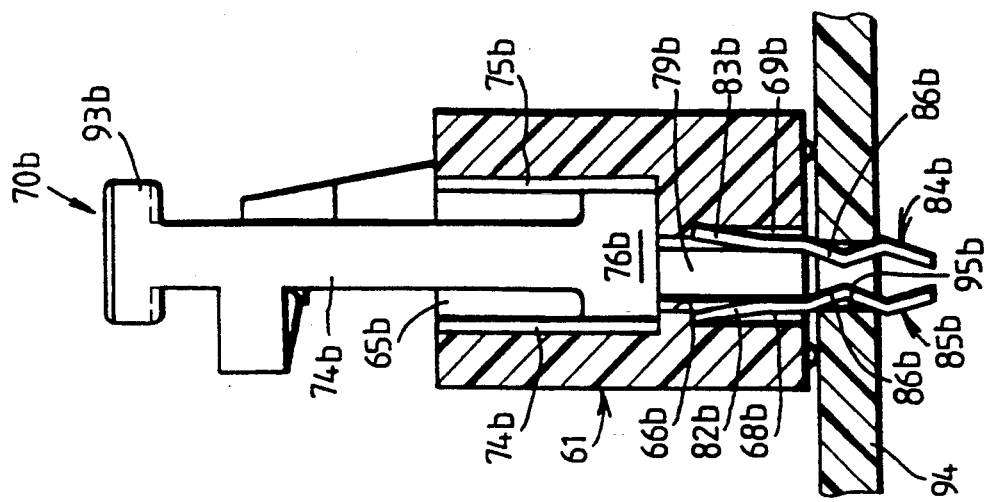
FIG. 9 is a fragmentary elevational view partly in traversed section of the right end portion of single in-line memory module socket shown with metallic inlaid member mounted in the insulating housing.
Figure 8:
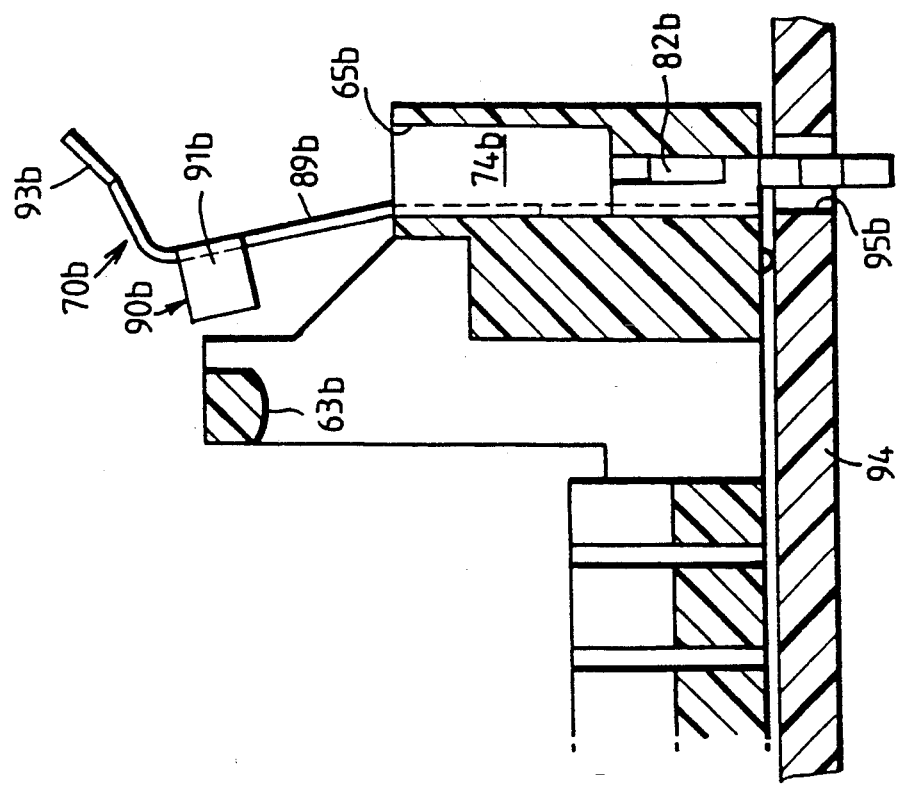
FIG. 8 is a fragmentary elevational view partly in vertical section of the right end portion of single in-line memory module socket shown with metallic inlaid member mounted in the insulating housing.

For mounting, as shown in FIGS. 6 and 7, the inlaid member 70a is inserted into the first mounting hole 65a, and inlaid walls 80a, 79a and 81a are inserted into the second mounting hole 66a, and each of inlaid 82a and 83a is mounted in respective mounting slots 68a and 69a. The inlaid walls 74a, 75a and 76a are mounted in the first mounting hole 65a. The inlaid projections 82a and 83a lock into respective mounting slots 68a and 69a, thus securely locking the inlaid member 70a.

The insulated housing 61 is mounted to printed circuit board 94 by mounting pegs 73a and 73b. The inherent resilience of peg members 84a and 85a permit the neck portion 86a to attach to the mounting aperture 95a so that a spacing "d" is maintained between the bottom surface of insulating housing 61 and top surface of printed circuit board 94. Therefore, the length of the spacing "d" shall not be increased due to the force of soldering fluid flowing upwardly within the soldering stove.

The guiding incline surface 91a permits the single in-line memory module (not shown) to slide over and lock the module with the latching surface 92a. The module can be released by pressing the liberating portion 73a to force in the direction of arrow 96a so that latching surface 92a disengages from the module.

As the structure of the right end portion and left end portion are symmetrical with each other it is not necessary to duplicate the above description for the right end portion. The reference numbers applied to the structure of right end portion apply to the left end portion, except that the "a" is marked for left end portion and "b" for right end portion.

Figure 18:
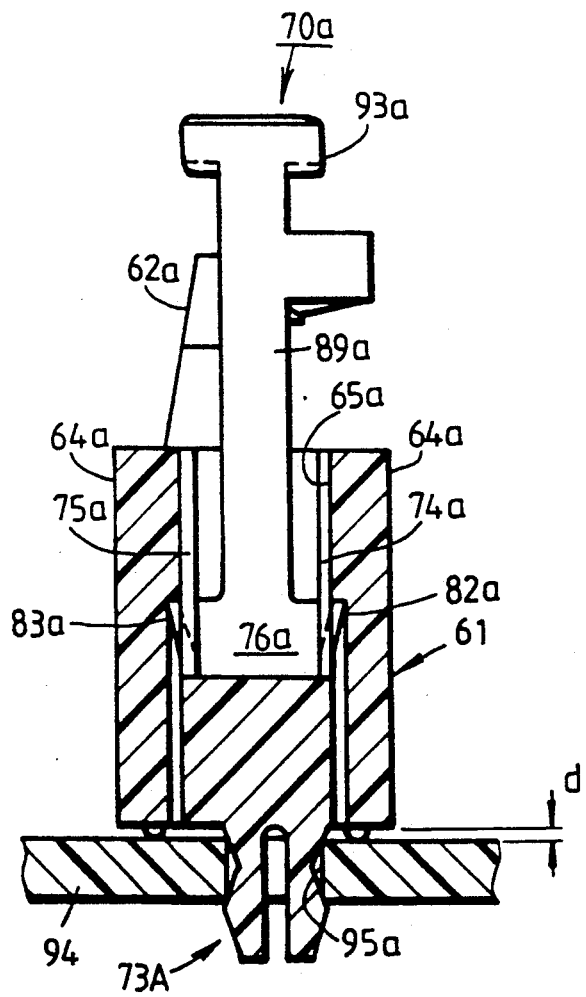
FIG. 18 is a perspective view of another embodiment of retention post of single in-line memory module socket.

Illustrated in FIG. 18 is another embodiment of mounting peg 73a, where the mounting peg 73a integrally extends downward from the insulating housing 61 (but the latching portion and latch can be fabricated in accordance with the prior arts).

The durable latch with mounting peg of memory module socket is characterized as follows:

1. The inlaid member 70a includes inlaid portion 71a, latching portion 72a and mounting peg 73a.

2. The insulating housing can be mounted on the printed circuit board 94 by using the special mounting function of mounting peg 73a so that the spacing "d" between the two can be maintained during soldering process. If the socket is damaged, it can be easily released from the printed circuit board 94.

3. In the prior art, during the welding the contact pin 55 to the printed circuit board 32, the mounting pegs 51 and 52 fail to be firmly secured to the printed circuit board 32 because the soldering fluid flowing upwardly, moving the socket 40 with it. For this reason, a lead block is used to clamp the socket 40 during welding and soldering processes this extra requirement is inefficient. With this special mounting function of mounting peg 73a, the use of the memory module socket of this invention is very convenient for mounting or releasing the insulating housing on/from the printed circuit board 94.

I claim:

1. A single in-line memory module socket adapted to be mounted on a printed circuit board to form a holder with a series of resilient contact elements that are provided for engaging with a contact pad located on an edge of a single in-line memory module being inserted into said holder, said socket comprising:
   an insulating housing with left and right sides, with said left side being symmetrical to said right side, an elongated socket, and
   a plurality of slots mounted perpendicular to said elongated socket between the ends of said insulating housing;
   each of said left and said right side of said insulating housing further comprises:
   a retention post that extends upward from said insulating housing,
   a securing projection that extends transversely from an upper portion of said retention post,
   a mounting portion that extends upward from said insulating housing, and
   an inlaid metal member that is attached to said mounting portion and includes a latching portion, an inlaid portion, and a securing portion;
   wherein said mounting portion includes a first mounting hole that is connected to a second mounting hole with said first mounting hole having a larger cross section than said second mounting hole, and a pair of mounting slots located on opposite sides of said second mounting hole;
   wherein said inlaid portion of said inlaid metal member includes several inlaid walls that are adapted to be inserted into said first and said second mounting holes of said mounting portion, and a pair of inlaid projections that are adapted to fit into said mounting slots of said mounting portion;
   wherein said latching portion of said inlaid metal member includes an arm portion that extends upward from said inlaid portion, a latching projection that extends transversely from said arm portion, and a liberating portion that extends upward from said arm portion; and
   wherein said securing portion of said inlaid metal member includes at least two peg members that extend downward from said inlaid portion and are removably attached to a securing hole of said printed circuit board.

2. A single in-line memory module socket according to claim 1, wherein,
   said peg members include a shoulder portion that is attached to said inlaid portion and is larger than an attached neck portion, and a guiding portion that is attached to said neck portion and has a leading end.

3. A single in-line memory module socket adapted to be mounted on a printed circuit board to form a holder with a series of resilient contact elements that are provided for engaging with a contact pad located on an edge of a single in-line memory module being inserted into said holder, said socket comprising:
   an insulating housing with left and right sides, with said left side being symmetrical to said right side,
   an elongated socket, and
   a plurality of slots mounted perpendicular to said elongated socket between the ends of said insulating housing;
   each of said left and said right side of said insulating housing further comprises:
   a retention post that extends upward from said insulating housing,
   a securing projection that extends transversely from an upper portion of said retention post,
   a securing portion,
   a mounting portion that extends upward from said insulating housing, and
   an inlaid metal member that is attached to said mounting portion and includes a latching portion, and an inlaid portion;

wherein said mounting portion includes a first mounting hole that is connected to a second mounting hole with said first mounting hole having a larger cross section than said second mounting hole, and a pair of mounting slots located on opposite sides of said second mounting hole;

wherein said inlaid portion of said inlaid metal member includes several inlaid walls that are adapted to be inserted into said first and said second mounting holes of said mounting portion, and a pair of inlaid projections that are adapted to fit into said mounting slots of said mounting portion;

wherein said latching portion of said inlaid metal member includes an arm portion that extends upward from said inlaid portion, a latching projection that extends transversely from said arm portion, and a liberating portion that extends upward from said arm portion; and wherein said securing portion includes at least two peg members that extend downward from said insulating housing and are removably attached to a securing hole of said printed circuit board.

4. A single in-line memory module socket according to claim 3, wherein, said peg members include a shoulder portion that is attached to said insulating housing and is larger than an attached neck portion, and a guiding portion that is attached to said neck portion and has a leading end.

* * * * *